United States Patent
Kang et al.

(10) Patent No.: US 7,100,322 B2
(45) Date of Patent: Sep. 5, 2006

(54) METHOD OF MANUFACTURING AN ALTERNATING PHASE SHIFT MASK

(75) Inventors: Myung-Ah Kang, Busan (KR); In-Kyun Shin, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 316 days.

(21) Appl. No.: 10/368,368

(22) Filed: Feb. 20, 2003

(65) Prior Publication Data

US 2003/0232254 A1    Dec. 18, 2003

(30) Foreign Application Priority Data

Jun. 12, 2002    (KR) .............................. 2002-32975

(51) Int. Cl.
*G01F 9/00* (2006.01)
*G03C 5/00* (2006.01)

(52) U.S. Cl. ............................................. 43/5; 430/323
(58) Field of Classification Search .................. 430/5, 430/322–324, 394
See application file for complete search history.

(56) References Cited

U.S. PATENT DOCUMENTS

| | | | | |
|---|---|---|---|---|
| 5,292,623 A | * | 3/1994 | Kemp et al. ................. | 430/313 |
| 5,792,578 A | * | 8/1998 | Tzu et al. ...................... | 430/5 |
| 6,524,755 B1 | * | 2/2003 | Jin et al. ........................ | 430/5 |
| 6,660,649 B1 | * | 12/2003 | Dao et al. ................... | 438/717 |
| 6,759,171 B1 | * | 7/2004 | Kalk .............................. | 430/5 |
| 6,841,309 B1 | * | 1/2005 | Alpay et al. ................... | 430/5 |
| 2002/0127881 A1 | * | 9/2002 | Xiao .......................... | 438/784 |

FOREIGN PATENT DOCUMENTS

| | | |
|---|---|---|
| JP | 11-258773 | 9/1999 |
| KR | 1998-025850 | 7/1998 |

* cited by examiner

*Primary Examiner*—S. Rosasco
(74) *Attorney, Agent, or Firm*—Volentine Francos & Whitt, PLLC

(57) ABSTRACT

A method of manufacturing an alternating phase shift mask can be carried out in a short amount of time. A 180° phase shift region is formed using a multi-step etching process, and then a 0° phase region is formed. Forming the phase shift regions in this sequence minimizes the number of rounds of photolithography that have to be carried out in the method.

6 Claims, 4 Drawing Sheets

METHOD OF MANUFACTURING AN ALTERNATING PHASE SHIFT MASK

BACKGROUND OF THE INVENTION

1. Field of the Invention

The present invention relates to the photolithography process used to manufacture semiconductor devices. More particularly, the present invention relates to a method of manufacturing a phase shift mask of a photolithographic exposure apparatus.

2. Description of the Related Art

A highly integrated semiconductor device is manufactured by selectively exposing a photoresist layer formed on a wafer to light projected through a reticle. The reticle bears a fine pattern that is to be transferred to the photoresist layer.

A phase shift mask is a reticle that includes both a light blocking layer and a light transmitting layer. Conventional phase shift masks include alternating phase shift masks and attenuated phase shift masks. The alternating phase shift mask comprises a 0° phase region and a 180° phase region, the latter of which is formed by etching a quartz substrate to a predetermined depth. The attenuated phase shift mask also comprises a 0° phase region and a 180° phase region, which are constituted by a phase shift layer on a substrate.

A method of manufacturing a conventional alternating phase shift mask will now be described referring to FIGS. 1A through 1D. First, as shown in FIG. 1A, a blocking layer is formed on a quartz substrate 10. A photoresist pattern (not shown) is formed on the blocking layer using a photolithography process. A blocking layer pattern 15 is formed by patterning the blocking layer so as to have a shape corresponding to that of the photoresist pattern. The blocking layer pattern 15 defines a 0° phase region 'a' and a 180° phase region 'b'. The photoresist pattern is then removed. Next, another photoresist layer is formed on the quartz substrate 10, and the photoresist layer is exposed and developed so that a photoresist pattern 25 is formed. The photoresist pattern 25 exposes the 180° phase shift region 'b'.

As shown in FIG. 1B, the quartz substrate 10 exposed by the photoresist pattern 25 is etched to a depth less than a predetermined depth 'd', wherein 'd' is the depth at which the mask would effect a phase shift of 180°. The reason why the quartz substrate 10 is first etched at phase region 'b' shallower than depth 'd' is as follows. Particles can be generated on the surface of the quartz substrate 10 during a photolithography process or an etching process for forming the photoresist pattern 25. If the quartz substrate 10 were subjected to the etching process while the particles were present on the surface of the substrate 10, the portion of the quartz substrate 10 under the particles would not be etched because the particles would act as a mask.

Isotropic etching has been suggested as a way to overcome this potential problem. However, isotropic etching results in the extension of an etching region and thus is difficult to adapt for use in forming a phase shift mask having a very fine pattern. Accordingly, when forming a conventional phase shift mask, a multi-step etching method is performed in which the quartz substrate 10 is anisotropically etched throughout part of its thickness, particles on its surface are removed by a cleaning process, and then the quartz substrate 10 is etched again. That is, the quartz substrate 10 is etched to a predetermined depth using the photoresist pattern 25, the photoresist pattern 25 is removed using a well-known method, and the surface of the resultant structure of the quartz substrate 10 is cleaned to remove the particles.

Then, as shown in FIG. 1C, another photoresist pattern 25 is formed on the quartz substrate 10 by a photolithography process to thereby expose the 180° phase shift region 'b'. The quartz substrate 10, which has been already etched to a particular depth, is further etched at the 180° phase shift region 'b' using the second photoresist pattern 25 as a mask. The photolithography process, the etching process, and the cleaning process are repeated as many times as necessary until a trench 30 having the desired depth 'd' is formed at the 180° phase region 'b' of the quartz substrate 10, as shown in FIG. 1D.

Here, the predetermined depth 'd' of the trench 30, capable of shifting the phase of exposure light by 180°, is determined to satisfy the following mathematic formula 1:

$$d=\lambda/2(n-1)$$

wherein $\lambda$ denotes the wavelength of the exposure light and n denotes the refractive index of the quartz substrate 10. Accordingly, the predetermined depth 'd' of the trench 30 is dependent on the wavelength of light and the refractive index of the quartz substrate 10.

However, the multi-step etching method described above typically requires at least several rounds of the photolithography process, the etching process, and the cleaning process to form a 0° phase shift region 'a' and then a 180° phase shift region 'b' in a quartz substrate. Moreover, the photolithography process itself comprises a series of processes, i.e., coating, exposing, hardening and developing processes. At least one day is required to perform such a photolithography process just once. Accordingly, three to five days are required to manufacture a phase shift mask using the conventional multi-step etching method.

SUMMARY OF THE INVENTION

It is an object of the present invention to provide a method of manufacturing an alternating phase shift mask, which method can be performed in a short amount of time.

It is more specific object of the present invention to provide a method of manufacturing an alternating phase shift mask, that omits at least one of the rounds of the photolithography process required by the prior art method.

To achieve of these objects, the present invention provides a method of manufacturing an alternating phase shift mask wherein the 0° phase shift region is formed after the 180° phase shift region.

First, a blocking layer, i.e. a layer that is more opaque than not with respect to an exposure light, is formed on a transparent substrate such as a quartz substrate.

Next, one portion of the blocking layer and the underlying portion of the substrate are etched to form a trench in the substrate having a depth at which the substrate will serve as the 180° phase shift region of the mask. To this end, a predetermined portion of the blocking layer is patterned. The substrate is etched using the patterned blocking layer as a mask. The resultant substrate is then cleaned to remove any particles which reside on the exposed portion of the substrate. The etching and cleaning steps are repeated until the trench attains the desired depth.

Subsequently, another portion of the blocking layer is etched until another portion of the substrate is exposed, thereby forming the 0° phase shift region of the mask.

BRIEF DESCRIPTION OF THE DRAWINGS

The above and other objects and advantages of the present invention will become more apparent by referring to the following detailed description of the preferred embodiment thereof made with reference to the attached drawings, of which.

DETAILED DESCRIPTION OF THE PREFERRED EMBODIMENTS

Figure 1A:
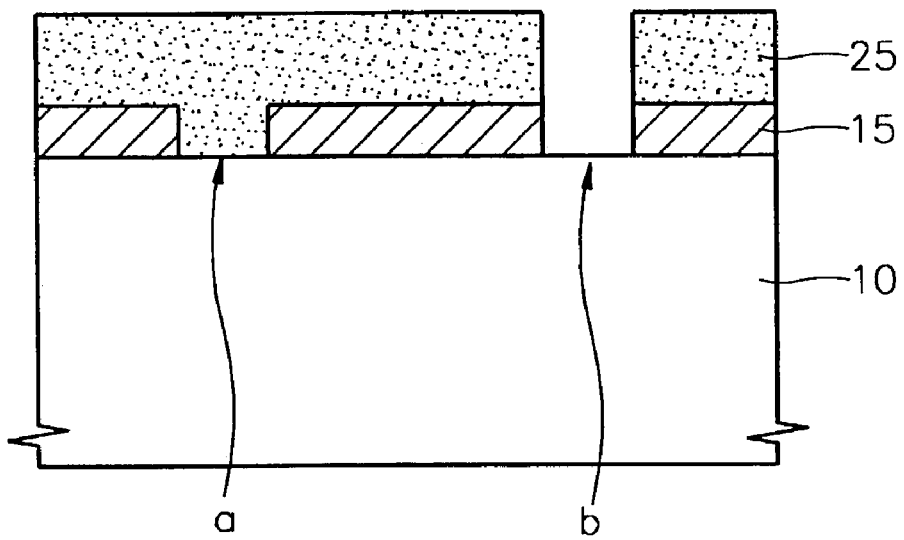
FIGS. 1A through 1D are cross-sectional views illustrating a method of manufacturing a conventional alternating phase shift mask.
Figure 1B:
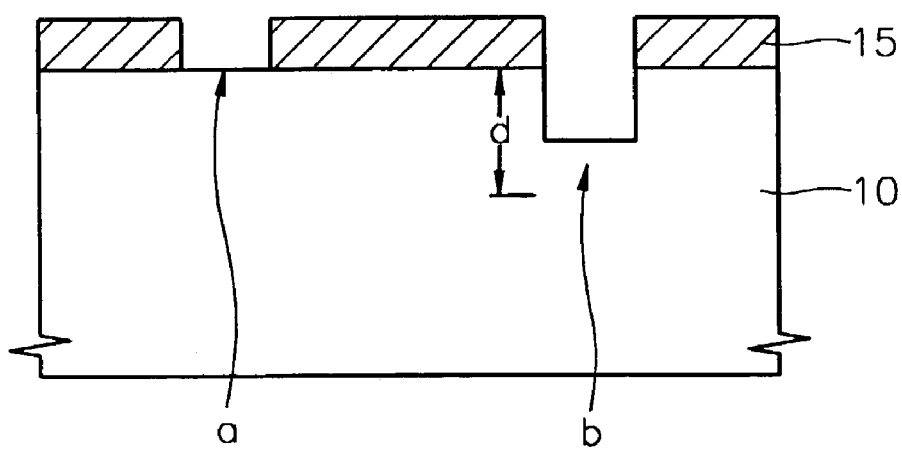
Figure 1C:
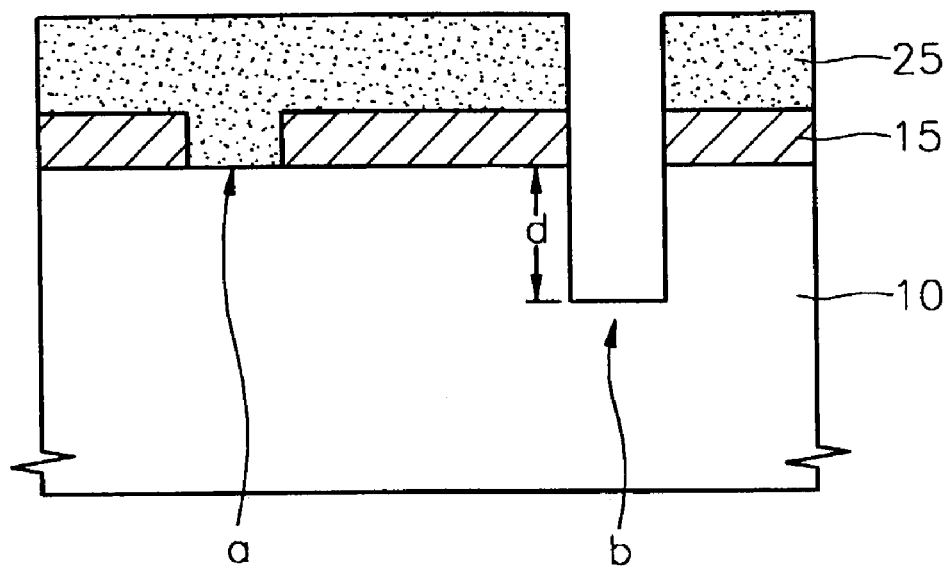
Figure 1D:
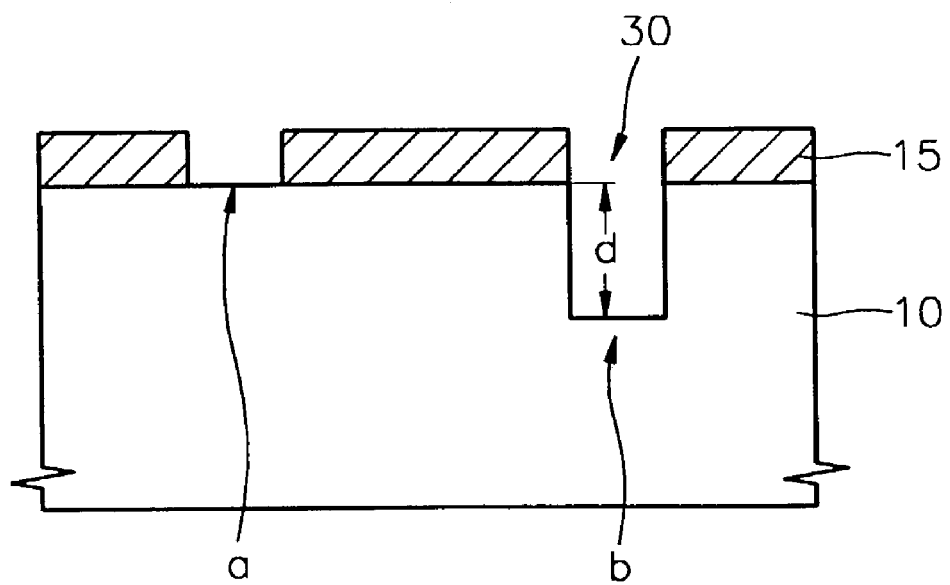

The present invention now will be described more fully with reference to the accompanying drawings, in which a preferred embodiment of the invention is shown. In the drawings, the thickness of layers and regions are exaggerated for clarity. It will also be understood that when a layer is referred to as being "on" another layer or substrate, such a description includes the layer in question being disposed directly on the other layer or substrate, or intervening layers being present therebetween. Also, like reference numerals designate like elements throughout the drawings.

Figure 2A:
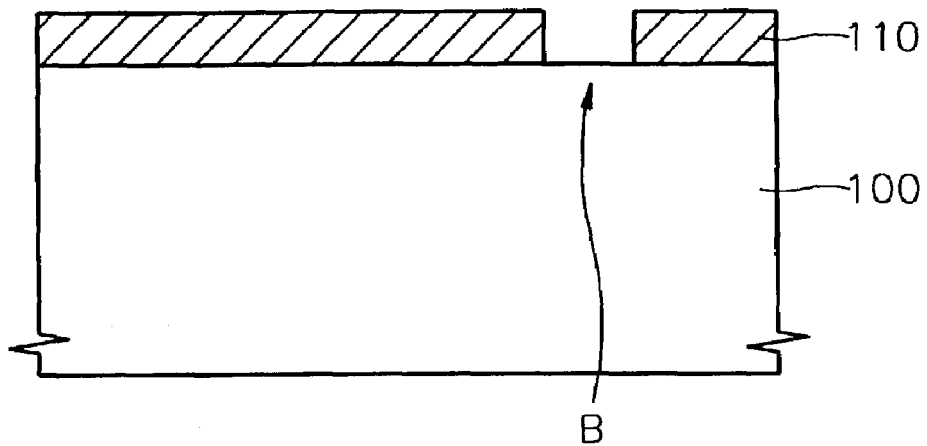
FIGS. 2A through 2D are cross-sectional views illustrating a method of manufacturing an alternating phase shift mask according to the present invention.

First, referring to FIG. 2A, a blocking layer is formed on the quartz substrate 100. The blocking layer can be formed of a material capable of absorbing 100% of the incident light. For example, the blocking layer may be a layer of chromium. A photoresist pattern (not shown) is formed on the blocking layer using a well-known photolithography process so as to expose a 180° phase shift region 'B' of the substrate 100. The blocking layer is etched using the photoresist pattern A as a mask to form a blocking pattern 110 that defines the 180° phase shift region 'B'. Next, the photoresist pattern is removed. In this case, the blocking layer pattern 110 defines only the 180° phase shift region 'B'.

Figure 2B:
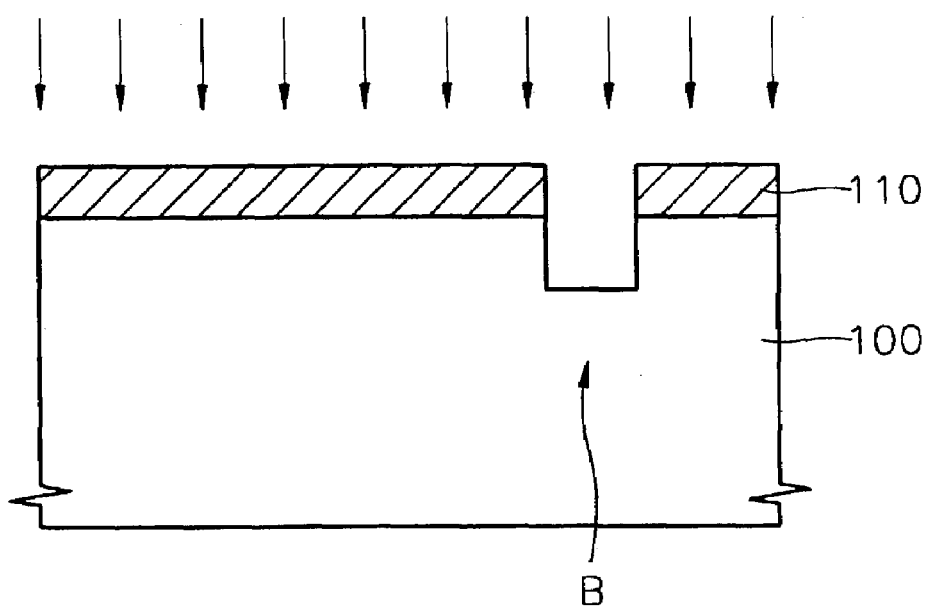

Next, as shown in FIG. 2B, the exposed quartz substrate 100 is etched at region 'B' to a predetermined depth using the blocking pattern 100 as a mask. Next, the quartz substrate 100 is cleaned to remove particles from its surface. The arrows in the figure indicate the cleaning process.

Figure 2C:
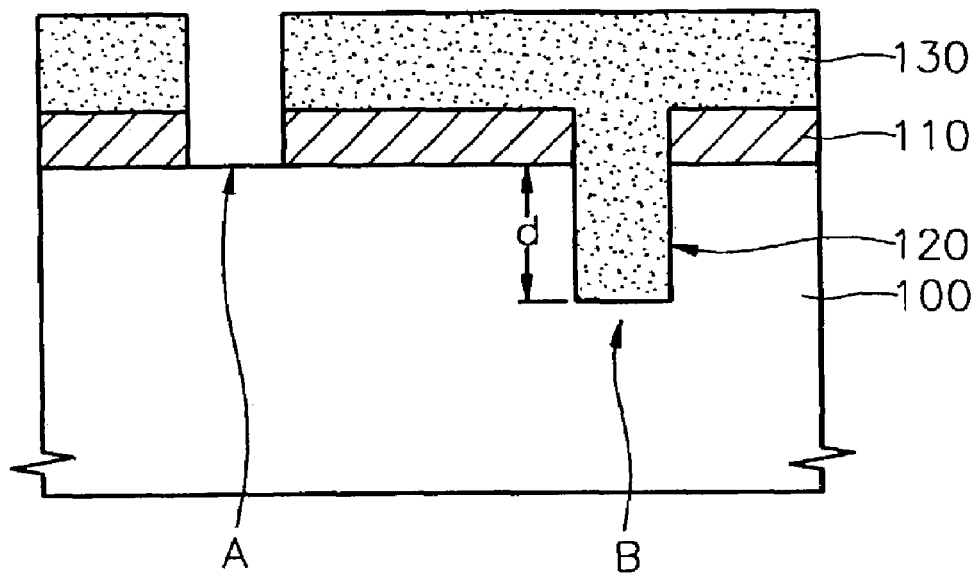

The process of etching and cleaning the quartz substrate 100 is repeated at least once until the 180° phase shift region 'B' is formed, in other words, until a trench 120 having a depth 'd' is formed in the quartz substrate 100 (where 'd' is the depth required to shift the phase of the exposure light by 180° as shown in FIG. 2C). In this case as well, the depth 'd' is set to satisfy formula 1. At this time, i.e., during the etching and cleaning of the quartz substrate 100, the 0° phase region is not defined. Hence, a photoresist pattern, corresponding to that used in the prior art to cover the 0° phase region 'a' during the etching of the substrate 10 (FIG. 1A), is not required.

Figure 2D:
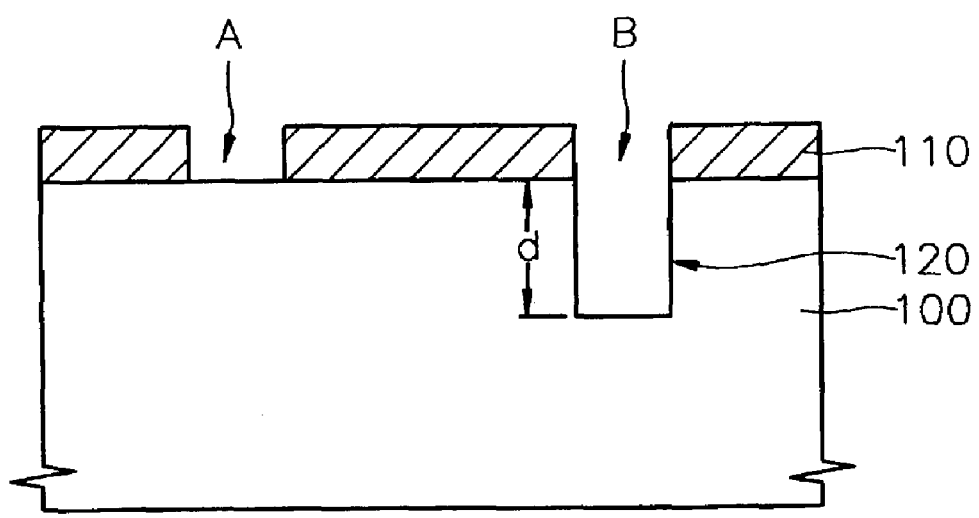

Next, a photoresist pattern 130 is formed on the quartz substrate 100 in which the trench 120 has been formed (FIG. 2C). The photoresist pattern 130 exposes the blocking pattern 110 at a region corresponding to the 0° phase region 'A', and fills the trench 120 at a region corresponding to the 180° phase shift region 'B'. The 0° phase region 'A' is formed by etching only the portion of the blocking pattern 110 exposed by the photoresist pattern 130. The photoresist pattern 130 is then removed (FIG. 2D).

As described above in detail, according to the present invention, the 180° phase shift region is formed first and then the 0° phase region is formed. Accordingly, at least one round of photolithography in the prior art technique, i.e., that for blocking the 0° phase shift region, is rendered unnecessary by practicing the present invention. Because the photolithography process requires at least one day to complete, the present invention is advantageous in that it requires significantly less time to execute than the prior art.

Finally, although the present invention has been particularly shown and described with reference to the preferred embodiment thereof, the invention may, however, be embodied in many different forms readily apparent to those skilled in the art that. Thus, various changes in form and details may be made in the present invention without departing from the true spirit and scope of the invention as defined by the appended claims.

What is claimed is:

1. A method of manufacturing an alternating phase shift mask having a 0° phase shift region and a 180° phase shift region, the method comprising:

providing a substrate having thereon a blocking layer that is substantially opaque with respect to an exposure light, wherein the substrate is substantially transparent with respect to the exposure light;

etching one portion of the blocking layer and the underlying portion of the substrate to form a trench in the substrate having a depth at which the exposure light will undergo a 180° phase shift when transmitted through the substrate at the trench, whereby the 180° phase shift region of the mask is formed at the trench; and subsequently forming a layer on the substrate that fills said trench and exposes another portion of the blocking layer, and etching said another portion of the blocking layer while the trench is filled and until another portion of the substrate is exposed, thereby forming the 0° phase shift region of the mask at said another exposed portion of the substrate.

2. The method of claim 1, wherein the forming of the 180° phase shift region comprises:

patterning a predetermined portion of the blocking layer, etching the substrate using the patterned blocking layer as a mask, and subsequently cleaning the substrate to remove any particles which reside on the portion of the substrate exposed by the etching thereof.

3. The method of claim 2, wherein said etching the substrate using the patterned blocking layer as a mask, and said subsequent cleaning of the substrate are repeated at least once.

4. A method of manufacturing an alternating phase shift region, comprising:

(a) providing a substrate having thereon a blocking pattern of material that is substantially opaque with respect to an exposure light, wherein the substrate is substantially transparent to the exposure light, and the blocking pattern a portion of the substrate where a 180° phase shift region is to be formed;

(b) etching the exposed portion of the substrate to a predetermined depth, using the blocking pattern as a mask;

(c) cleaning the resultant structure at the exposed surface of the substrate;

(d) repeating steps (b) and (c) at least once until a trench constituting the 180° phase shift region of the mask is formed;

(e) subsequently forming a photoresist pattern on the blocking pattern, the photoresist pattern exposing a region of the blocking pattern corresponding to a 0° phase region of the mask and covering the 180° phase shift region; and (f) etching the blocking pattern using the photoresist pattern as a mask to form the 0° phase region.

5. The method of claim 4, and further comprising (g) subsequently removing the photoresist pattern.

6. A method of manufacturing a phase shift mask having a non phase shift region and a phase shift region, the method comprising:

providing a substrate having thereon a blocking layer that is substantially opaque with respect to an exposure light, wherein the substrate is substantially transparent with respect to the exposure light;

etching one portion of the blocking layer and the underlying portion of the substrate to a predetermined depth to form a trench in the substrate such that the exposure light will undergo a phase shift when transmitted through the substrate at the trench, thereby forming the phase shift region of the mask; and subsequently forming a layer on the substrate that fills said trench and exposes another portion of the blocking layer, and etching said another portion of the blocking layer while the trench is filled and until another portion of the substrate is exposed, thereby forming the non-phase shift region of the mask at said another exposed portion of the substrate.

* * * * *